US006214685B1

(12) United States Patent
Clinton et al.

(10) Patent No.: US 6,214,685 B1
(45) Date of Patent: Apr. 10, 2001

(54) PHOSPHATE COATING FOR VARISTOR AND METHOD

(75) Inventors: Caroline Clinton, Roughgrange; Trevor R. Spalding, Cork; Andrew Mark Connell, Cork; John Barrett, Cork; James F. Rohan, Cork, all of (IE)

(73) Assignee: Littelfuse, Inc., Des Plaines, IL (US)

( * ) Notice: Subject to any disclaimer, the term of this patent is extended or adjusted under 35 U.S.C. 154(b) by 0 days.

(21) Appl. No.: 09/108,961

(22) Filed: Jul. 2, 1998

(51) Int. Cl.[7] .......................... H01L 21/20; H01L 21/44; H01L 21/31; H01L 21/469

(52) U.S. Cl. .......................... 438/382; 438/384; 438/678; 438/763; 438/957

(58) Field of Search .................................. 438/382, 384, 438/678, 763, 957

(56) References Cited

U.S. PATENT DOCUMENTS 3,784,417 * 1/1974 Brown .
4,140,551 * 2/1979 Jones .
5,757,263 * 5/1998 Ravindranathan .
5,858,518 * 1/1999 Omote et al. .

OTHER PUBLICATIONS

Petrucci, "General Chemistry Principles and Modern Applications" 5th edition; p. 620 1989.*

* cited by examiner

*Primary Examiner*—Richard Booth
*Assistant Examiner*—Ron Pompey
(74) *Attorney, Agent, or Firm*—Carter, Ledyard & Milburn

(57) ABSTRACT

A method of providing a semiconductor device with a selectively deposited inorganic electrically insulative layer, the device having exposed semiconductor surfaces and electrically conductive metal end terminations, in which the device is saturated in a phosphoric acid solution to form a phosphate layer on the exposed surfaces of the semiconductor but not on the metal end terminations. The device is thereafter plated by a conventional plating process and the plating is provided only on the end terminations.

15 Claims, 1 Drawing Sheet

PHOSPHATE COATING FOR VARISTOR AND METHOD

BACKGROUND OF THE INVENTION

The present invention relates to nonlinear resistive devices, such as varistors, and more particularly to methods of making such devices using various plating techniques in which only the electrically contactable end terminals of the device are plated.

Nonlinear resistive devices are known in the art, and are described, for example, in U.S. Pat. No. 5,115,221 issued to Cowman on May 19, 1992, that is incorporated by reference.

With reference to FIG. 1, a typical device 10 may include plural layers 12 of semiconductor material with electrically conductive electrodes 14 between adjacent layers. A portion of each electrode 14 is exposed in a terminal region 16 so that electrical contact may be made therewith. The electrodes 14 may be exposed at one or both of opposing terminal regions, and typically the electrodes are exposed at alternating terminal regions 16 as illustrated. The exposed portions of the electrodes 14 are contacted by electrically conductive end terminals 18 that cover the terminal regions 16.

While an apparently simple structure, the manufacture of such devices has proved complex. For example, the attachment of the end terminals 18 has proved to be a difficult problem in search of a simplified solution. Desirably, the terminal regions 16 may be plated with nickel and tin-lead metals to increase solderability and decrease solder leaching. The process parameters in plating nickel to zinc oxide semiconductor bodies has proved particularly vexing and has required complex solutions.

One method of affixing the end terminals 18 is to use a conventional barrel plating method in which the entire device is immersed in a plating solution. However, the stacked layers are semiconductor material, such as zinc oxide, that may be conductive during the plating process so that the plating adheres to the entire surface of the device. Thus, in order to provide separate end terminals as shown in FIG. 1, a portion of the plating must be mechanically removed after immersion, or covered before immersion with a temporary plating resist comprised of an organic substance insoluble to the plating solution. However, the removal of the plating or organic plating resist is an extra step in the manufacturing process, and may involve the use of toxic materials that further complicate the manufacturing process.

It has also been suggested that the metal forming the end terminals 18 be flame sprayed onto the device, with the other portions of the surface of the device being masked. Flame spraying is not suitable for many manufacturing processes because it is slow and includes the creation of a special mask, with the additional steps attendant therewith. See, for example, U.S. Pat. No. 4,316,171 issued to Miyabayashi, et al. on Feb. 16, 1982.

It is also known to react a semiconductor body, having electrically conductive metal end terminations, with phosphoric acid to selectively form a phosphate on the semiconductor body prior to providing end terminations using conventional barrel plating. However, in this method the phosphate layer is formed by the reaction of the phosphoric acid with the metal oxide at the surface of the body to form an electrically insulative metal phosphate layer. The process stops once the surface of the exposed body has been reacted resulting in a thin phosphate layer which is susceptible to erosion during the plating process. See, U.S. Pat. No. 5,614,074 issued to Ravindranathan on Mar. 25, 1997 and owned by the assignee of the present invention.

Accordingly, it is an object of the present invention to provide a novel method and device that obviates the problems of the prior art.

It is another object of the present invention to provide a novel method and device in which an electrically insulating, inorganic layer is formed on portions of the device before the device is plated.

It is still another object of the present invention to provide a novel method and device in which a phosphoric acid solution is reacted with the exposed surface of stacked zinc oxide semiconductor layers to form a zinc phosphate coating.

It is still another object of the present invention to provide a novel method and device in which a passivation solution reacts with the exposed ceramic surface of the device to form a zinc phosphate coating.

It is still a further object of the present invention to provide a novel method and device in which a semiconductor device is saturated in a phosphoric acid solution to form a zinc phosphate layer by deposition and by reaction of the solution with the device surface.

It is yet another object of the present invention to provide a novel method and device in which a zinc phosphate coating protects portions of the device that are not to be plated when the end terminals are formed.

It is a further object of the present invention to provide a novel method of providing a semiconductor device with an inorganic electrically insulative layer in which a device with exposed semiconductor surfaces and metal end terminations is submerged in phosphoric acid to form a phosphate on the exposed surfaces of the semiconductor, and in which the device is thereafter barrel plated and the plating is provided only on the end terminations because the phosphate is not electrically conductive.

It is yet a further object of the present invention to provide a novel method and nonlinear resistive device having a body of layers of semiconductor material with an electrode between adjacent layers, in which the body of the nonlinear resistive device is coated with an inorganic layer that is electrically insulating, except at a terminal region of the body where an electrode is exposed for connection to an end terminal, and in which the coated body is plated with an electrically conductive metal to form the end terminal in a process in which the body becomes electrically conductive and in which the electrically conductive metal does not plate the coated portions of the body because the inorganic layer is not electrically conductive.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
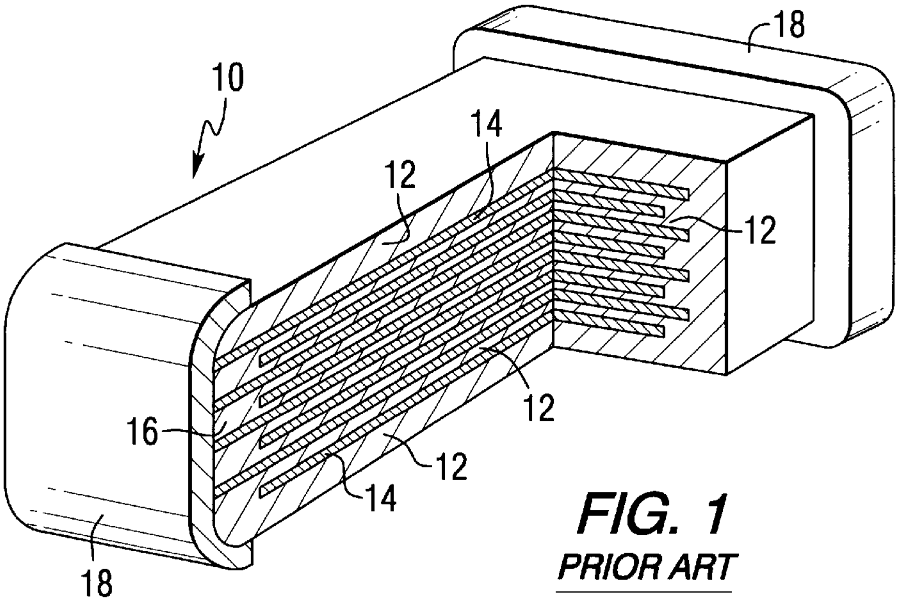
FIG. 1 PRIOR ART
FIG. 1 is a pictorial depiction of a varistor typical of the prior art.
Figure 2:
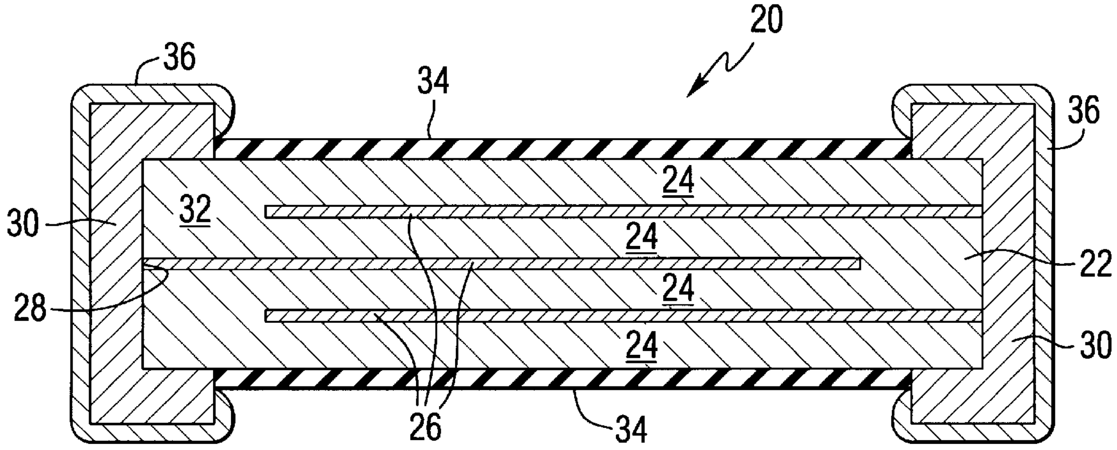
FIG. 2 is vertical cross section of an embodiment of the device of the present invention.

With reference now to FIG. 2, an embodiment of a nonlinear resistive element 20 may include a body 22 having stacked semiconductor layers 24 with generally planar electrodes 26 between adjacent pairs of the semiconductor layers 24. The semiconductor layers 24 comprise a metal oxide such as zinc oxide or iron oxide and need not be comprised of pure metal oxide as layers 24 may be comprised of a ceramic consisting principally of metal oxide. Each electrode 26 may have a contactable portion 28 that is exposed for electrical connection to the electrically conductive metal (preferably silver, silver-platinum, or silver-palladium) end terminations 30 that cover the terminal regions 32 of the body 22 and contact the electrodes 26. The portions of the body 22 not covered with the end terminations 30 are coated with an electrically insulative zinc phosphate layer 34. The end terminations 30 may be plated with layers 36 of electrically conductive metal that form electrically contactable end portions for the resistive element 20.

By way of example, in one embodiment the zinc oxide semiconductor layers 24 may have the following composition in mole percent: 94–98% zinc oxide and 2–6% of one or more of the following additives; bismuth oxide, cobalt oxide, manganese oxide, nickel oxide, antimony oxide, boric oxide, chromium oxide, silicon oxide, aluminum nitrate, and other equivalents.

The device body 22 and the end terminations 30 may be provided conventionally. The deposited phosphate layer 34 may be formed on the device body 22 by a passivation process by reacting a phosphoric acid solution with the metal oxide semiconductor layers 24 exposed at the exterior of the body 22. The device body 22 is saturated in the phosphoric acid solution to thereby form the phosphate layer 34 by deposition of phosphate in the acid solution onto the exposed semiconductor layers 24.

In one embodiment of the device 20 wherein the body 22 comprises zinc oxide (or a ceramic including principally zinc oxide) semiconductor layers 24, the phosphoric acid solution may comprise phosphoric acid, zinc oxide or a zinc salt, and a pH modifier such as ammonia. Zinc phosphate forms in the solution and deposits onto the exposed surface of the zinc oxide semiconductor layer 24 during the passivation process.

The phosphoric acid solution desirably has a pH of 2 to 4 but the pH of solution may be 1 to 5. The reaction may take place for 10 to 50 minutes at an operating temperature of 15° C. to 70° C. The time required for the reaction is dependent on the thickness of the layer required for the specific temperature and pH conditions of the reaction. The operating conditions of the reaction may also be modified within the specified ranges to accommodate different semiconducting device designs.

By way of example, one part phosphoric acid (85%) may be added to one hundred parts deionized water. The pH of the solution is modified to 2 and the solution is heated to a temperature above 30° C. The body 22 with end terminations 30 affixed may be washed with acetone and dried at about 100° C. for ten minutes. The washed device may be submerged in the phosphoric acid solution for thirty minutes to provide the layer 34. After the layer 34 is applied, the body may be cleaned with deionized water and dried at about 100° C. for about fifteen minutes. The layer 34 does not adhere to the end terminations 30 because the silver or silver-platinum in the end terminations 30 is not affected by the phosphoric acid. The phosphoric acid solution may also be applied by spraying, instead of submerging, the device.

After the zinc phosphate layer 34 has been applied, the device may be plated with an electrically conductive metal, such as nickel and tin-lead, to provide the layers 36. A conventional barrel plating process may be used, although the pH of the plating solution is desirably kept between about 4.0 and 6.0. In the barrel plating process the device is made electrically conductive and the plating material adheres to the electrically charged portions of the device. The metal plating of layers 36 does not plate the zinc phosphate layer 34 during the barrel plating because the zinc phosphate is not electrically conductive.

The zinc phosphate layer 34 is electrically insulating and may be retained in the final product to provide additional protection. The layer 34 does not effect the I-V characteristics of the device.

In an alternative embodiment, the phosphate layer may be an inorganic oxide layer formed by the reaction of phosphoric acid with the metal oxide semiconductor in the device. For example, instead of zinc oxide, the semiconductor may be iron oxide, a ferrite, etc.

Figure 3:
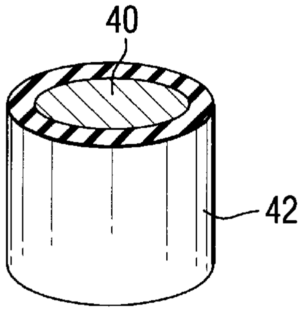
FIG. 3 is a pictorial depiction of a high energy disc varistor with an insulating layer of the present invention thereon.
Figure 4:
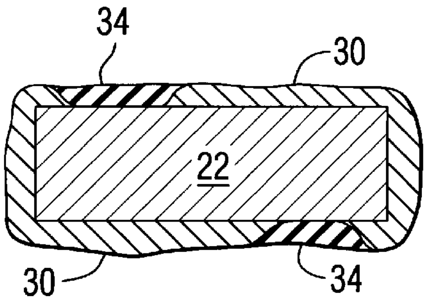
FIG. 4 is a pictorial depiction of a surface mount device with an insulating layer of the present invention.

In another alternative embodiment, the method described above may be used in the manufacture of other types of electronic devices. For example, a high energy disc varistor has a glass or polymer insulating layer on its sides. With reference to FIG. 3, instead of glass or polymer, the disc varistor 40 may have an insulating layer 42 of phosphate formed in the manner discussed above. The present invention is applicable to other varistor products such as a surface mount device depicted in FIG. 4, radial parts, arrays, connector pins, discoidal construction, etc.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A method of making a nonlinear resistive device comprising the steps of:

(a) providing a body for the nonlinear resistive device, the exterior of the body being a ceramic comprising an oxide semiconductor except at a terminal region where an end termination is provided;

(b) reacting a phosphoric acid solution with the body to form an electrically insulative phosphate coating, while depositing an electrically insulative phosphate coating on the exposed oxide semiconductor, the end termination not being coated with the phosphate; and (c) saturating the body in a plating solution to thereby coat the body with an electrically conductive metal;

wherein the electrically conductive metal does not form on the phosphate coated portions of the body because the phosphate is less active than the end terminations.

2. The method of claim 1 further comprising the step of electrically charging the device prior to saturating the device in a plating solution, wherein the electrically conductive metal does not form on the phosphate coated portions of the body because the phosphate is not electrically conductive.

3. The method of claim 1 wherein the end termination comprises a layer of a metal selected from the group consisting of silver, silver-platinum, and silver-palladium.

4. The method of claim 1 wherein the body comprises zinc oxide or iron oxide.

5. The method of claim 4 wherein the body comprises in mole percent, 94–98% zinc oxide and 2–6% of one or more of the additives selected from the group of additives consisting of bismuth oxide, cobalt oxide, manganese oxide, nickel oxide, antimony oxide, boric oxide, chromium oxide, silicon oxide, and aluminum nitrate.

6. The method of claim 1 wherein the phosphoric acid solution comprises phosphoric acid, one or more of zinc oxide, iron oxide, zinc salt, or iron salt, and a pH modifier.

7. The method of claim 1 wherein the step of reacting phosphoric acid solution comprises the step of saturating the body in the phosphoric acid solution.

8. The method of claim 7 wherein the step of saturating the body comprises the step of submerging the body in a phosphoric acid solution having a pH of 1 to 5 for 10 to 50 minutes at 15° C. to 70° C.

9. The method of claim 8 wherein the phosphoric acid solution has a pH of 2 to 4.

10. The method of claim 8 wherein the step of saturating the body comprises the step of submerging the body in a phosphoric acid solution having a pH of about 2.5 for 25 to 35 minutes at 40° C. to 45° C.

11. The method of claim 1 wherein the step of saturating the body comprises the step of spraying the body with the phosphoric acid solution.

12. The method of claim 1 wherein the electrically conductive metal comprises at least one of nickel and tin-lead.

13. The method of claim 1 wherein the body is a varistor.

14. A method of providing an electrically insulative coating on a nonlinear resistive device comprising the steps of:

(a) providing a device having plural metal oxide layers with electrodes therebetween, the electrodes contacting at least one of two exterior electrically conductive metal end terminations that are separated by an exposed surface of the metal oxide semiconductor layers;

(b) providing a phosphoric acid solution comprising a phosphate; and (c) saturating the device in the phosphoric acid solution to thereby react the phosphoric acid solution with the exposed surface of the metal oxide semiconductor layers and to deposit phosphate formed in the solution onto the exposed surface to form a phosphate layer on the exposed surface of the semiconductor layer, the end terminations not being coated with the phosphate.

15. A method of providing an electrically insulative layer on a semiconductor device comprising the steps of:

(a) providing a semiconductor device having an exposed surface comprising metal oxide;

(b) providing a phosphoric acid solution comprising a phosphate; and (c) saturating the device in the phosphoric acid solution to thereby form an electrically insulative phosphate layer on the exposed metal oxide surface, said phosphate layer being formed by reaction of the acid with the exposed metal oxide surface and by deposition of the phosphate formed in the solution onto the exposed metal oxide surface.

* * * * *